United States Patent [19]

Yi

[11] Patent Number: 5,577,621

[45] Date of Patent: Nov. 26, 1996

[54] WAFER INSTALLING CASSETTE FOR SEMICONDUCTOR MANUFACTURING APPARATUS

[75] Inventor: Kyoung-Soo Yi, Daejeon, Rep. of Korea

[73] Assignee: Electronics & Telecommunications Research Institute, Daejeon, Rep. of Korea

[21] Appl. No.: 353,255

[22] Filed: Dec. 2, 1994

[30] Foreign Application Priority Data

May 31, 1994 [KR] Rep. of Korea ............... 94-12215

[51] Int. Cl.$^6$ ............................................. A47F 7/00
[52] U.S. Cl. .................................................. 211/41
[58] Field of Search ............... 211/41, 186; 206/454, 206/334; 118/500

[56] References Cited

U.S. PATENT DOCUMENTS

| | | | |
|---|---|---|---|
| 3,534,862 | 10/1970 | Shambelan | 211/41 |
| 5,054,418 | 10/1991 | Thompson et al. | 211/41 X |
| 5,154,299 | 10/1992 | Hwang | 211/41 X |
| 5,219,079 | 6/1993 | Nakamura | 211/41 |

Primary Examiner—Alvin C. Chin-Shue
Assistant Examiner—Sarah L. Purol
Attorney, Agent, or Firm—Antonelli, Terry, Stout & Kraus

[57] ABSTRACT

A wafer installing cassette for semiconductor manufacturing apparatus is disclosed, in which various sizes of wafer can be installed within a certain range. In the present invention, the wafer installing cassette includes two or more shelves each having a plurality of annular steps, and a shelf securing means for supporting the shelves, so that a plurality of wafers of different sizes can be loaded.

8 Claims, 2 Drawing Sheets

WAFER INSTALLING CASSETTE FOR SEMICONDUCTOR MANUFACTURING APPARATUS

FIELD OF THE INVENTION

The present invention relates to a wafer installing cassette for semiconductor manufacturing apparatus, in which the wafer size is not limited to permit wafers of various sizes within a certain range be installed.

BACKGROUND OF THE INVENTION

In order to raise productivity, a semiconductor manufacturing apparatus uses one of variously sized wafer cassettes for installing one of variously sized wafers.

Generally, in a semiconductor manufacturing machine, the size of a wafer is decided, and then, a cassette suited to the size of the wafer is installed. Therefore, when the size of the wafer is different, the cassette and all the related parts have to be replaced.

Further, there is the problem that, even in development or research equipment, the size of the wafer has to be fixed. Therefore, there is incurred additional cost for replacing the parts besides the existing equipment, and therefore, the productivity is lowered, while the product price is raised.

SUMMARY OF THE INVENTION

The present invention is intended to overcome the above described disadvantages of the conventional techniques.

Therefore, it is the object of the present invention to provide a wafer installing cassette for a semiconductor manufacturing apparatus, in which wafers of different sizes can be installed, so that wafers of various sizes can be handled without replacing the cassette.

In achieving the object of the present invention, the wafer installing cassette for a semiconductor manufacturing apparatus capable of carrying out the process by installing a plurality of wafers, includes: a shelf means for accommodating wafers regardless of the size of the wafers; and a shelf securing means for fixedly securing at least two or more shelves with certain intervals.

According to a first embodiment of the present invention, the shelf means consists of a pair of shelves including: annular steps for receiving wafers of different diameters; and a connecting piece with one of its rods extending by a certain length to be fixed to the shelf securing means.

According to a second embodiment of the present invention, the shelf securing means includes: a pair of supporting frames having an opposing structure, and having a plurality of slots for fixedly inserting the shelf connecting pieces; and a securing frame for fixedly connecting the supporting frames.

BRIEF DESCRIPTION OF THE DRAWINGS

The above object and other advantages of the present invention will become more apparent by describing in detail the preferred embodiment of the present invention with reference to the attached drawings in which:

FIG. 2 illustrates the shelf according to the present invention, in which:

DESCRIPTION OF THE PREFERRED EMBODIMENT

Figure 1:
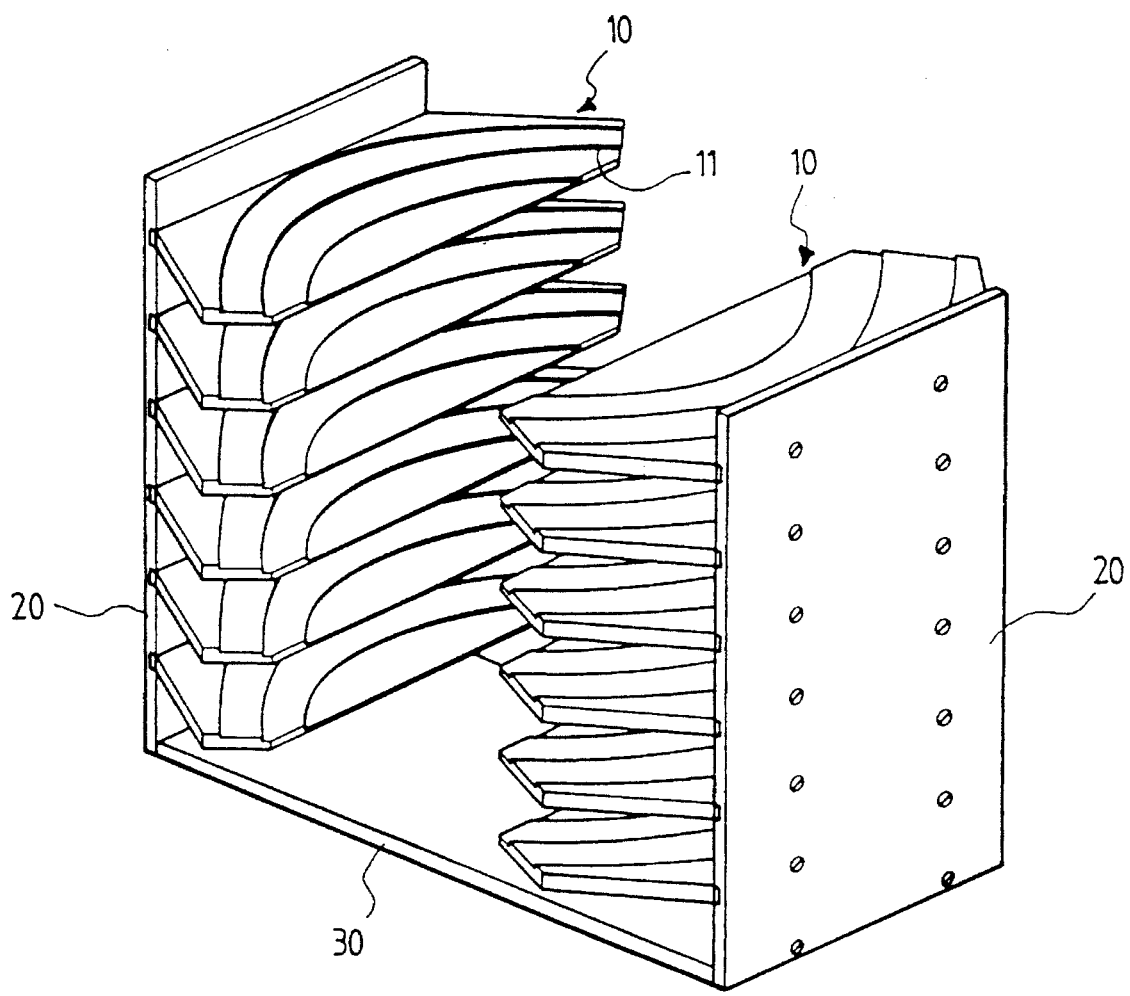
FIG. 1 is a perspective view of the cassette according to the present invention.

FIG. 1 is a perspective view of the cassette according to the present invention. As shown in FIG. 1, the cassette includes: a shelf means for installing wafers; and a shelf securing means for supporting and securing the shelf means.

The shelf means includes a plurality of shelves 10.

Figure 2A:
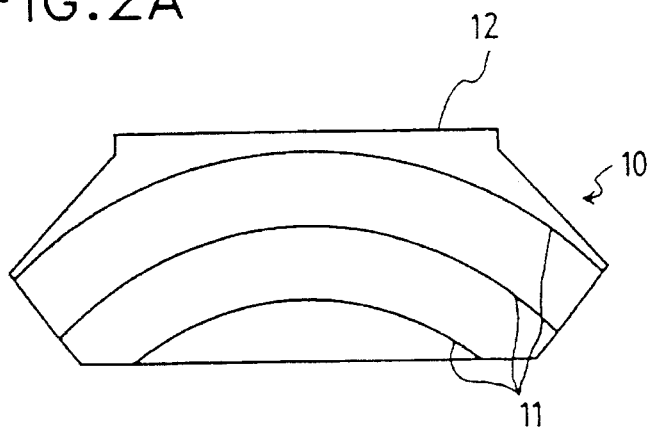
FIG. 2A is a plan view.
Figures 2B, 2C:
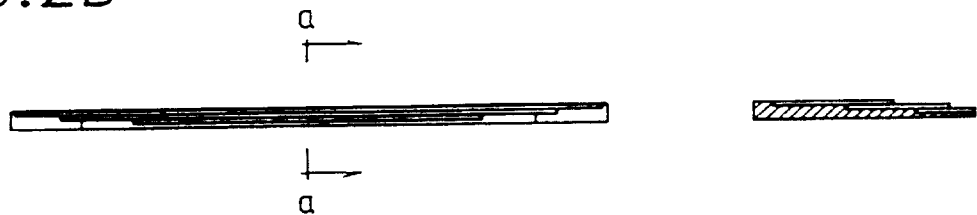
FIG. 2B is a frontal view.
FIG. 2C is a sectional view taken along a line a—a of FIG. 2B.

FIG. 2 illustrates the constitution of the shelf 10, in which FIG. 2A is a plan view, FIG. 2B is a frontal view, and FIG. 2C is a sectional view taken along a line a—a.

The shelf 10 includes: a plurality of annular steps 11 with sizes suited to the sizes of wafers to be supported by the shelf; and a connecting piece 12 for being fixedly connected to the shelf securing means.

The shelf securing means includes: a pair of supporting frames 20 for fixedly supporting the shelf 10; and a securing frame 30 for fixedly connecting the supporting frame as illustrated in FIG. 1.

The securing frame 30 is provided in the form of a rod, a bar or a plate.

Figure 3:
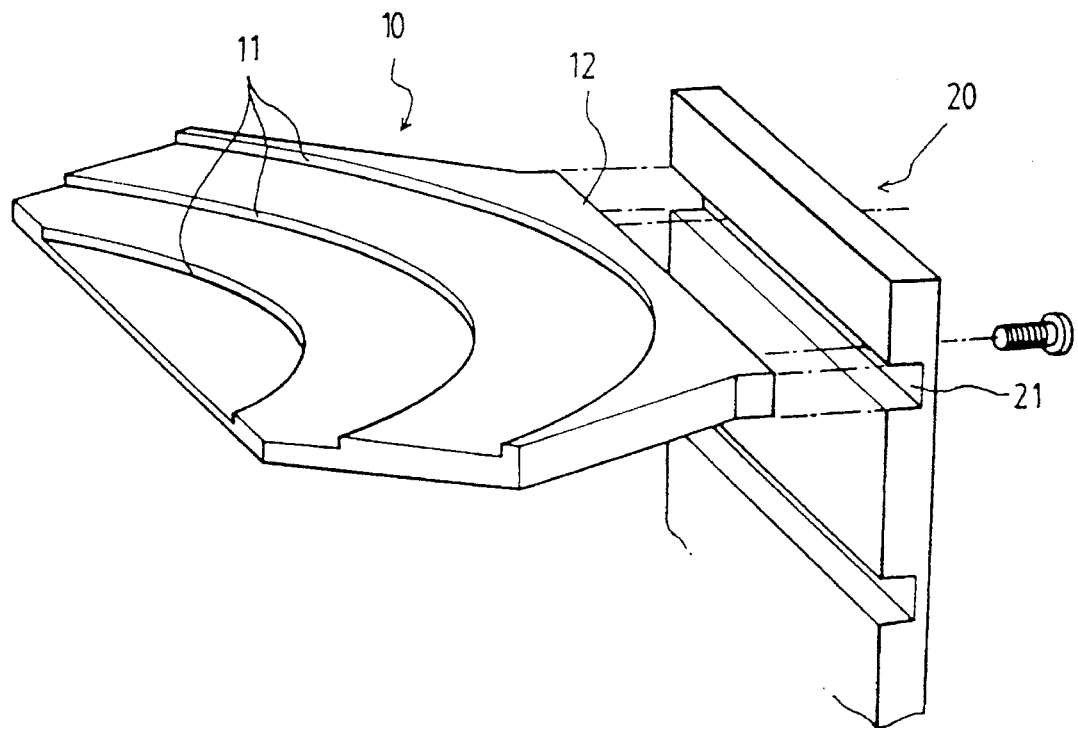
FIG. 3 is a perspective view of the critical portion of the supporting frame and the shelf according to the present invention.

FIG. 3 illustrates the critical portions showing the connecting relationship between the shelf 10 and the supporting frame 20. The connecting piece 12 of the shelf 10 is inserted into the slot 21 of the supporting frame 20, and is fastened by means of a bolt.

The supporting frame 20 is provided with a plurality of slots 21 so that the number of the shelves 10 can be adjusted.

The shelf 10 is provided with a plurality of annular steps 11 of different sizes, so that wafers of different sizes can be installed. When the wafer is installed, the wafer is positioned at a predetermined position.

The wafer of FIG. 1 is capable of loading up to 6 wafers, of up to three different sizes.

However, the cassette can be made to load more wafers so that the requirement of the equipment can be satisfied. Further, the diameters and the sizes can be more diversified.

If the cassette of the present invention is used in the semiconductor manufacturing equipment, wafers of various sizes can be installed regardless of the sizes.

The semiconductor manufacturing apparatus is expensive and uses a high vacuum, and is operated within a clean chamber in which dust or other particles have been removed.

However, even in the research field, different semiconductor manufacturing apparatuses have to be used for different wafer sizes, and therefore, the apparatus has to be procured based on the wafer size.

Only when wafers of various sizes can be handled simultaneously is mutual supporting and assistance achieved between the mass production field, the academic field and the research field. However, owing to the fact that the equipment is fixed to handle wafers of only one size, the mutual assistance has been difficult in the prior art.

If the wafer installing cassette according to the present invention is used, no restriction is imposed by the size of wafer, and therefore, the usefulness of the apparatus is improved.

Therefore, according to the present invention, the cost for replacing the semiconductor manufacturing apparatus can be saved, and the productivity can be improved, as well as lowering the product price.

What is claimed is:

1. A wafer installing cassette for a semiconductor manufacturing apparatus for installing a plurality of wafers comprising:

a shelf means for accommodating wafers of different diameters for use in installing the wafers of different diameters, the shelf means having a plurality of pairs of shelves, each pair of shelves having a plurality of annular steps with each step having a diameter for receiving a particular diameter of the wafers of different diameters;

a shelf securing means for securing the plurality of pairs of shelves with adjacent pairs of shelves being spaced apart by a set distance; and wherein the shelf means further includes a connecting piece attached to each shelf for connection to the shelf securing means.

2. A wafer installing cassette in accordance with claim 1 further comprising:

at least three pairs of shelves with the at least three pairs of shelves being spaced apart by the set distance.

3. A wafer installing cassette in accordance with claim 1 wherein:

the diameter of each annular step corresponds to a different one of the wafers of different diameters.

4. A wafer installing cassette in accordance with claim 1 wherein:

the diameter of each annular step corresponds to a different one of the wafers of different diameters.

5. A wafer installing cassette in accordance with claim 1 wherein the shelf securing means further comprises:

a pair of supporting frames for supporting the plurality of pairs of shelves and having a plurality of slots for receiving the connecting piece attached to each shelf and a securing frame connecting the pair of support frames.

6. A wafer installing cassette in accordance with claim 2 wherein the shelf securing means further comprises:

a pair of supporting frames for supporting the plurality of pairs of shelves and having a plurality of slots for receiving the connecting piece attached to each shelf and a securing frame connecting the pair of support frames.

7. A wafer installing cassette in accordance with claim 3 wherein the shelf securing means further comprises:

a pair of supporting frames for supporting the plurality of pairs of shelves and having a plurality of slots for receiving the connecting piece attached to each shelf and a securing frame connecting the pair of support frames.

8. A wafer installing cassette in accordance with claim 4 wherein the shelf securing means further comprises:

a pair of supporting frames for supporting the plurality of pairs of shelves and having a plurality of slots for receiving the connecting piece attached to each shelf and a securing frame connecting the pair of support frames.

* * * * *